US012346239B2

(12) United States Patent
Sharma et al.

(10) Patent No.: US 12,346,239 B2
(45) Date of Patent: Jul. 1, 2025

(54) TESTING ROBOTIC SOFTWARE SYSTEMS USING PERTURBATIONS IN SIMULATION ENVIRONMENTS

(71) Applicant: Accenture Global Solutions Limited, Dublin (IE)

(72) Inventors: Vibhu Saujanya Sharma, Bangalore (IN); Vikrant Shyamkant Kaulgud, Maharashtra (IN); Jhilam Bera, West Bengal (IN); Adam Patten Burden, Tampa, FL (US)

(73) Assignee: Accenture Global Solutions Limited, Dublin (IE)

( * ) Notice: Subject to any disclaimer, the term of this patent is extended or adjusted under 35 U.S.C. 154(b) by 92 days.

(21) Appl. No.: 17/893,330

(22) Filed: Aug. 23, 2022

(65) Prior Publication Data

US 2023/0070517 A1 Mar. 9, 2023

Related U.S. Application Data

(60) Provisional application No. 63/236,021, filed on Aug. 23, 2021.

(51) Int. Cl.
*G06F 11/3668* (2025.01)
*G06F 11/34* (2006.01)

(52) U.S. Cl.
CPC ...... *G06F 11/3688* (2013.01); *G06F 11/3461* (2013.01)

(58) Field of Classification Search
CPC .......................... G06F 11/3688; G06F 11/3461
See application file for complete search history.

(56) References Cited

U.S. PATENT DOCUMENTS 9,811,074 B1 * 11/2017 Aichele ................. B25J 9/1656
11,577,741 B1 * 2/2023 Reschka ............. B60W 50/045
(Continued)

OTHER PUBLICATIONS

Baskaran, Sidharth, et al. "Digital human and robot simulation in automotive assembly using siemens process simulate: a feasibility study." Procedia Manufacturing 34 (2019): 986-994. (Year: 2019).*
(Continued)

*Primary Examiner* — Bradley A Teets
*Assistant Examiner* — Joanne G Macasiano
(74) *Attorney, Agent, or Firm* — Polsinelli PC

(57) ABSTRACT

Implementations include providing a robotic model representative of a robotic system, determining baseline data by executing a simulation using the robotic model and a simulation world that represents the environment, generating, by a perturbation system, perturbations to be included in a set of test cases, each test case including at least one perturbation to at least one object relative to a baseline of the at least one object determined from the baseline data, determining test result data for the set of test cases by modifying the at least one object in view of the at least one perturbation to provide a modified object and executing the simulation with the modified object, and displaying a graph representative of the at least one object based on the baseline data and test result data for a test case, the graph depicting variance of the object during the simulation using the test case.

18 Claims, 8 Drawing Sheets

(56) References Cited

U.S. PATENT DOCUMENTS

| | | | | |
|---|---|---|---|---|
| 2004/0078685 A1* | 4/2004 | Glass | .................. | G06F 11/3656 |
| | | | | 714/38.14 |
| 2010/0083048 A1* | 4/2010 | Calinoiu | ............. | G06F 11/0787 |
| | | | | 714/38.11 |
| 2011/0296250 A1* | 12/2011 | Calsyn | .................. | G06F 11/362 |
| | | | | 714/E11.029 |
| 2014/0282425 A1* | 9/2014 | Zhao | .................. | G06F 11/3414 |
| | | | | 717/127 |
| 2019/0184561 A1* | 6/2019 | Yip | ........................ | G06N 3/044 |
| 2019/0318050 A1* | 10/2019 | Zapolsky | ................. | G06F 30/20 |
| 2020/0159648 A1* | 5/2020 | Ghare | .................. | G06F 9/4411 |
| 2020/0192327 A1* | 6/2020 | Khoo | .................. | G06Q 10/063 |
| 2020/0409816 A1* | 12/2020 | Gladisch | ............. | G06F 11/3452 |
| 2022/0048533 A1* | 2/2022 | Ödblom | .............. | G06F 11/3668 |
| 2023/0202511 A1* | 6/2023 | Atsmon | .................. | G06N 3/09 |
| | | | | 701/23 |

OTHER PUBLICATIONS

Joyeux, Sylvain, et al. "Simulation in the LAAS Architecture." International Conference on Robotics and Automation-Workshop on Software Development in Robotics. 2005. (Year: 2005).*

Miglino, Orazio, Henrik Hautop Lund, and Stefano Nolfi. "Evolving mobile robots in simulated and real environments." Artificial life 2.4 (1995): 417-434. (Year: 1995).*

Michel, Olivier. "Cyberbotics ltd. webots™: professional mobile robot simulation." International Journal of Advanced Robotic Systems 1.1 (2004): (Year: 2004)*

ROS.org [online], "ROS—Robot Operating System," available on or before Aug. 22, 2020 via Internet Archive: Wayback Machine URL<https://web.archive.org/web/20200822162125/https://www.ros.org/>, retrieved on May 10, 2023, retrieved from URL<https://www.ros.org/>, 4 pages.

* cited by examiner

TESTING ROBOTIC SOFTWARE SYSTEMS USING PERTURBATIONS IN SIMULATION ENVIRONMENTS

CROSS-REFERENCE TO RELATED APPLICATIONS

This application claims priority to and the benefit of commonly assigned U.S. Prov. App. No. 63/236,021, filed on Aug. 23, 2021, the disclosure of which is expressly incorporated herein by reference in the entirety.

BACKGROUND

Various development platforms and middleware are available for development of robotic systems. Example development platforms include, without limitation, Robot Operating System (ROS), Robot Studio, and AWS RoboMaker. Development platforms are equipped with software testing features. Generally, the testing includes unit testing, library testing, integration testing, and the like. Functional testing of robot use cases is traditionally conducted on a simulator and/or on real robotic hardware.

However, there are challenges in executing functional testing of robotic systems. For example, functional testing of robotic systems is largely ad-hoc and not fully standardized. Replication of a real-world environment in a simulator is challenging and can further cause production issues. The cost of testing with real robotic hardware can also be inefficient, expensive, and time-consuming. In addition, traditional functional testing in either the simulator or using real robotic hardware is still unable to cover all of the use cases, because robots may work under various real, dynamic, and unstructured environments. Further, the introduction of artificial intelligence (AI), machine-learning (ML) and cloud computing make these environments unstructured in nature. As a result, the complexity of functional testing of a robotic system is not only limited to its hardware and mechanical operations, but also the software executed to operate robotic systems is increasingly complicated.

SUMMARY

Implementations of the present disclosure are generally directed to a robotic system testing platform for functional testing of a robotic system. More particularly, implementations of the present disclosure are directed to a robotic system testing platform that provides a computer-executed simulation to simulate naturally occurring perturbations that represent uncertainty of unstructured, real-world environments within which robotic systems will operate.

In some implementations, actions include providing a robotic model representative of a robotic system that is to operate in a real-world environment, determining baseline data by executing a simulation using the robotic model and a simulation world, the simulation world representing the environment, generating, by a perturbation system, perturbations to be included in a set of test cases, each test case including at least one perturbation to at least one object relative to a baseline of the at least one object determined from the baseline data, determining test result data for each test case in the set of test cases by, for each test case, modifying the at least one object in view of the at least one perturbation to provide a modified object and executing the simulation with the modified object, and displaying a graph representative of the at least one object based on the baseline data and test result data for a test case, the graph depicting variance of the object during the simulation using the test case. Other implementations of this aspect include corresponding systems, apparatus, and computer programs, configured to perform the actions of the methods, encoded on computer storage devices.

These and other implementations can each optionally include one or more of the following features: perturbations include one or more of location perturbation, node kill perturbation, latency perturbation, and add object perturbation; the at least one perturbation includes a location perturbation and the modified object is in a modified position based on the location perturbation; actions further include, after determining the baseline data, receiving user input indicating a degree of uncertainty associated with at least one parameter of the at least one object, the at least one perturbation being generated based on the degree of uncertainty; one or more perturbations are provided based on a distribution; the distribution is used to select nodes of objects represented in one or more of the robotic model and the simulation world, to which the one or more perturbations are to be applied in test cases of the set of test cases; the baseline data provides a set of active nodes of one or more of the robotic model and the simulation world, the set of active nodes including nodes that are active during the simulation, perturbations only being applied to active nodes during execution of the simulation using the test cases; each of the robotic model and the simulation world are provided as a set of nodes in a node graph, the nodes communicating with one another using a publish-subscribe paradigm; and the test result data indicates one of a soft failure and a hard failure.

The present disclosure also provides a computer-readable storage medium coupled to one or more processors and having instructions stored thereon which, when executed by the one or more processors, cause the one or more processors to perform operations in accordance with implementations of the methods provided herein.

The present disclosure further provides a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

It is appreciated that methods in accordance with the present disclosure can include any combination of the aspects and features described herein. That is, methods in accordance with the present disclosure are not limited to the combinations of aspects and features specifically described herein, but also include any combination of the aspects and features provided.

The details of one or more implementations of the present disclosure are set forth in the accompanying drawings and the description below. Other features and advantages of the present disclosure will be apparent from the description and drawings, and from the claims.

It is appreciated that methods in accordance with the present disclosure can include any combination of the aspects and features described herein. That is, for example, apparatus and methods in accordance with the present disclosure are not limited to the combinations of aspects and features specifically described herein, but also may include any combination of the aspects and features provided.

The details of one or more implementations of the present disclosure are set forth in the accompanying drawings and the description below. Other features and advantages of the present disclosure will be apparent from the description, drawings, and claims.

BRIEF DESCRIPTION OF DRAWINGS

Like reference numbers and designations in the various drawings indicate like elements.

DETAILED DESCRIPTION

Figure 1:
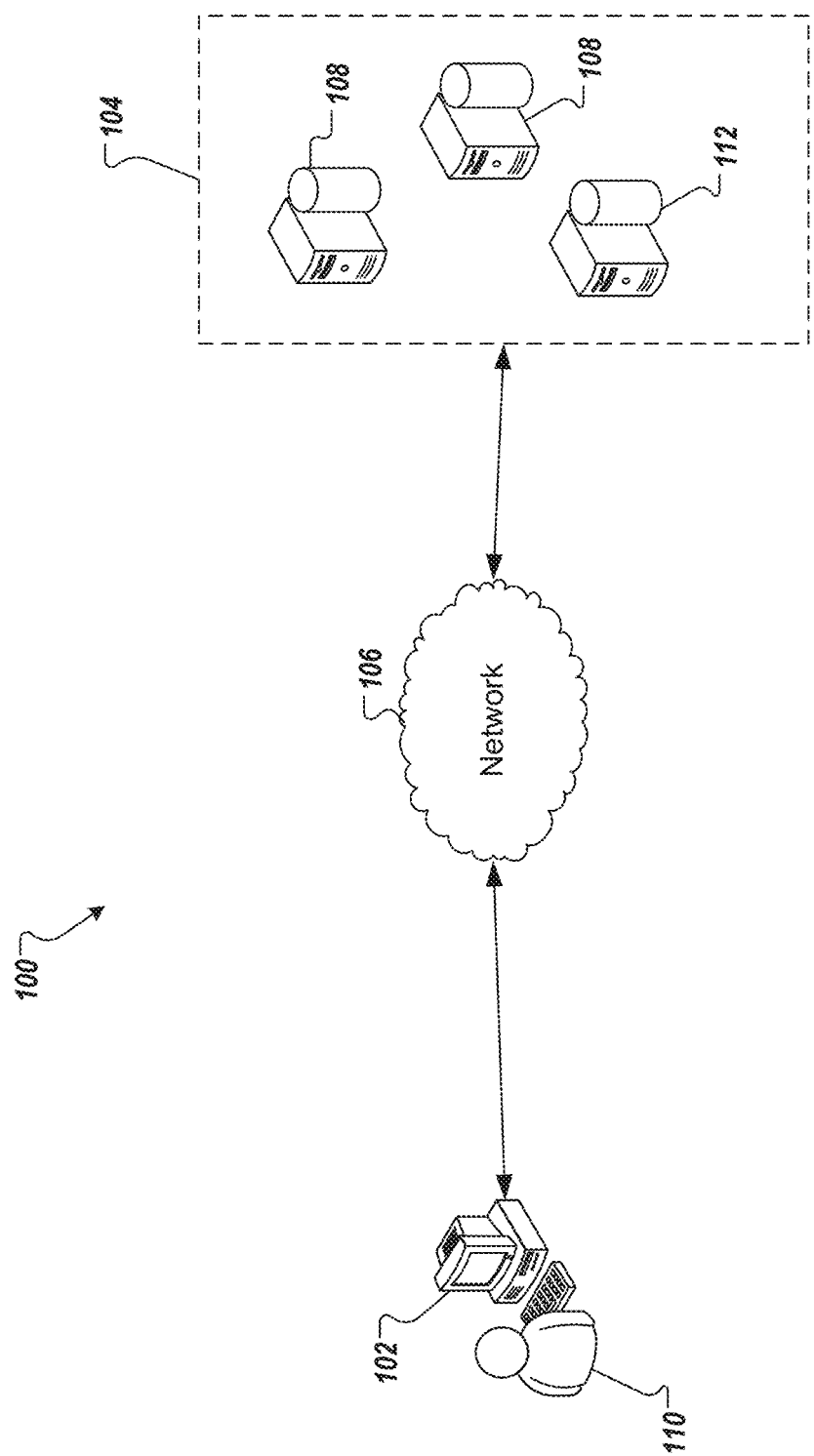
FIG. 1 depicts an example system that can execute implementations of the present disclosure.

Implementations of the present disclosure are generally directed to a robotic system testing platform for functional testing of a robotic system. More particularly, implementations of the present disclosure are directed to a robotic system testing platform that provides a computer-executed simulation to simulate naturally occurring perturbations that represent uncertainty of unstructured, real-world environments within which robotic systems will operate. In some implementations, actions include providing a robotic model representative of a robotic system that is to operate in a real-world environment, determining baseline data by executing a simulation using the robotic model and a simulation world, the simulation world representing the environment, generating, by a perturbation system, perturbations to be included in a set of test cases, each test case including at least one perturbation to at least one object relative to a baseline of the at least one object determined from the baseline data, determining test result data for each test case in the set of test cases by, for each test case, modifying the at least one object in view of the at least one perturbation to provide a modified object and executing the simulation with the modified object, and displaying a graph representative of the at least one object based on the baseline data and test result data for a test case, the graph depicting variance of the object during the simulation using the test case.

To provide context for implementations of the present disclosure, and as introduced above, various development platforms and middleware are available for development of robotic systems. Example development platforms include, without limitation, Robot Operating System (ROS), Robot Studio, and AWS RoboMaker. Development platforms are equipped with software testing features. Generally, the testing includes unit testing, library testing, integration testing, and the like. Functional testing of robot use cases is traditionally conducted on a simulator and/or on real robotic hardware.

However, there are challenges in executing functional testing of robotic systems. For example, functional testing of robotic systems is largely ad-hoc and not fully standardized. Replication of a real-world environment in a simulator is challenging and can further cause production issues. The cost of testing with real robotic hardware can also be inefficient, expensive and time-consuming. In addition, traditional functional testing in either the simulator or using real robotic hardware is still unable to cover all of the use cases, because robots may work under various real, dynamic, and unstructured environments. Further, the introduction of artificial intelligence (AI), machine-learning (ML), and cloud computing make these environments unstructured in nature. As a result, the complexity of functional testing of a robotic system is not only limited to its hardware and mechanical operations, but also the software executed to operate robotic systems is increasingly complicated.

Further, traditional testing of robotics systems is largely ad hoc and has limited standardization, if any. Simulation of the real-world is challenging and testing on a simulated world can cause production issues. Moreover, traditional approaches do not focus on the interplay of the functionality of the robotic system that is under tests and the random perturbations (variations, uncertainties) of its components and the environment, within which the robotic system is to operate. Robotics engagements are becoming increasingly complex and therefore the sources and types of perturbations in these engagements. For example, a range of real-world scenarios can be considered and can include, for example and without limitation: single robot, single robot with environment, single robot with human(s), a fleet of robots, and a fleet of robots with humans.

In the scenario of a single robot, the robot will have individual components that need to communicate to fulfill respective functions, while the environmental considerations are limited to fixed and/or otherwise non-affecting entities that the robot directly interacts with. In the scenario of a single robot with environment, the robot will have individual components that need to communicate to fulfill respective functions, and the environment will have changing and/or non-deterministic characteristics. For example, the environment can have fixed features (e.g., a table that the robot is secured to) and non-fixed features (e.g., wind, light, temperature, humidity). In the scenario of a single robot with human(s), a range of robot-human interactions need be considered, which, by nature, can be changing and/or non-deterministic. The scenarios of a fleet of robots and a fleet of robots with humans compound these considerations.

In view of this, implementations of the present disclosure provide a robotic system testing platform that simulates natural perturbations representing uncertainty of unstructured, real-world environments, within which a robotic system will operate. As described in further detail herein, the robotic system testing platform of the present disclosure provides simulated function testing of robotic systems that is more thorough, efficient, and robust than traditional functional testing.

As discussed in further detail herein, robotic systems can be stacked with two types of controllers, high-level controllers and low-level controllers. The high-level controllers can take discrete decisions and plan how the robotic system achieves objectives. The low-level controllers include actuators that actuate components of the robotic system. These low-level controllers can control the continuous dynamics of the robotic system. Software of the robotic system orchestrates the controllers. In a robotic system, there are many individual software components, each software component serving specific operations. In an example context of ROS, the software components are referred to as nodes, each of which is tested during testing.

For functional testing of robotic systems, developers can use simulators to simulate the robotic system and the environment. For example, Gazebo, which can be described as an open source robotics simulator, enables replication of a robotic system and an environment within which the robotic system will operate. In the simulator, pre-defined actions of the robotic system can be viewed and assessed by the subject matter experts (SMEs) for problems. However, the testing of robotic software is not trivial, because, in the real-world, robotic systems operate within dynamic, non-deterministic environments. Testing in production/post-deployment, real-world environments cannot always account for peculiarities of the interactions. However, testing in such real-world environments is a sub-optimal option in terms of efficiency, effort, and cost.

In some instances, existing testing mechanisms focus on a set of well-defined test cases and often omit the interplay of the functionality of the robotic system and perturbations (random variations) that the components of the robotic system, components of other robotic systems operating in the same environment as the robotic system, and the environment generally can experience. This may cause any failure to deliver functionality due to such perturbations to be missed at the time of testing and thereon failures or sub-optimal performance during operation, which can become expensive, and time- and resource-consuming to fix.

In view of the foregoing, implementations of the present disclosure provide a robotic system testing platform for computer-executed functional testing of robotic systems by simulating operation of robotic systems in presence of variations and/or uncertainties, which can be collectively referred to as perturbations. Perturbations can be described as random variations within environments, within which robotic systems operate, as well as the robotic systems themselves. As described in further detail herein, the robotic system testing platform of the present disclosure enables evaluation of measurable impact of perturbations on functionality of the robotic system. In some implementations, perturbations can be generated based on user input defining one or more types of perturbations to be tested and, for each type of perturbation, an extent (degree) of the perturbation. In some implementations, one or more types of perturbations and/or extent(s) can be randomly selected to simulate the uncertainty of real-world, unstructured environments, within which the robotic system will operate. Implementations of the present disclosure also provide configurable plugins that can be plugged into the existing testing systems to enable components to be selected in the simulation and perturbations to be inserted during testing. Moreover, the entirety of the robotic system that is simulated can be evaluated to determine how the robotic system reacts in optimal and/or adverse conditions with perturbations.

Implementations of the present disclosure can be used for an iterative what-if analysis. More particularly, implementations of the present disclosure can capture a given initial simulation state and reset the simulated environment after examining different degrees and types of perturbations. In this manner, a verifiable log of events of interest can be provided that are visualized to show types of failures and the extent thereof, or successes, and can be integrated in typical software development and IT operations (DevOps) pipelines and defect tracking systems.

Implementations of the present disclosure are described in further detail herein with non-limiting reference to ROS, which can be described as a set of software libraries and tools (e.g., drivers, algorithms) that support building robot applications. ROS includes concepts of nodes, topics, master node, subscriber node, and publisher node. In general, a node represents a process that performs computation. Nodes are combinable into a graph and communicate with one another using a publish-subscribe paradigm that includes streaming topics, remote procedure call (RPC) services, and parameter server(s). Topics can be described as named buses, over which nodes exchange messages. Topics have anonymous publish/subscribe semantics, which decouples the production of information from its consumption. A master node provides naming and registration services to the rest of the nodes in the ROS-based robotic system. The master node tracks publishers and subscribers to topics as well as services. A subscriber node is subscribed to one or more topics and receives messages associated with the topic. A publisher node publishes messages associated with one or more topics for consumption by subscriber nodes. In some examples, a node can be both a publisher node, publishing messages associated with topics, and a subscriber node, receiving messages associated with topics that the node is subscribed to.

By way of non-limiting example, an example robotic system can include an actuator, a sensor, and a servo motor controller. The actuator and the sensor can each be represented as a publisher node in software (e.g., provided in a computer-readable file, such as Python/C++ file), which encapsulates a script that serves as a computational process. A topic can include message data (e.g., telemetry, flag, string, integer) that is published by a publisher node and is consumed by one or more subscriber nodes. The servo motor controller can be represented as a subscriber node in software (e.g., provided in a computer-readable file, such as Python/C++ file), which encapsulates a script that serves as a computational process.

FIG. 1 depicts an example system 100 that can execute implementations of the present disclosure. The example system 100 includes a computing device 102, a back-end system 104, and a network 106. In some examples, the network 106 includes a local area network (LAN), wide area network (WAN), the Internet, or a combination thereof, and connects web sites, devices (e.g., the computing device 102), and back-end system (e.g., one of the servers 108 in the back-end system 104). In some examples, the network 106 can be accessed over a wired and/or a wireless communications link.

In some examples, the computing device 102 can include any appropriate type of computing device such as a desktop computer, a laptop computer, a handheld computer, a tablet computer, a personal digital assistant (PDA), a cellular telephone, a network appliance, a camera, a smart phone, an enhanced general packet radio service (EGPRS) mobile phone, a media player, a navigation device, an email device, a game console, or an appropriate combination of any two or more of these devices or other data processing devices.

In the depicted example, the back-end system 104 includes at least one server system 108, and data store 112 (e.g., database). In some examples, the at least one server system 112 hosts one or more computer-implemented services that users can interact with using computing devices. For example, the server system 108 can host a robotic system testing platform including a testing system and a simulator in accordance with implementations of the present disclosure. For example, a user 110 can interact with the computing device 102 to execute testing of a robotic system using the robotic system testing platform of the present disclosure. In some examples, the user 110 is a SME that interacts with the robotic system testing platform through one or more UIs to select a robotic system that is to be tested, a number of iterations of testing, parameters for generation of perturbations, and the like.

Figure 2A:
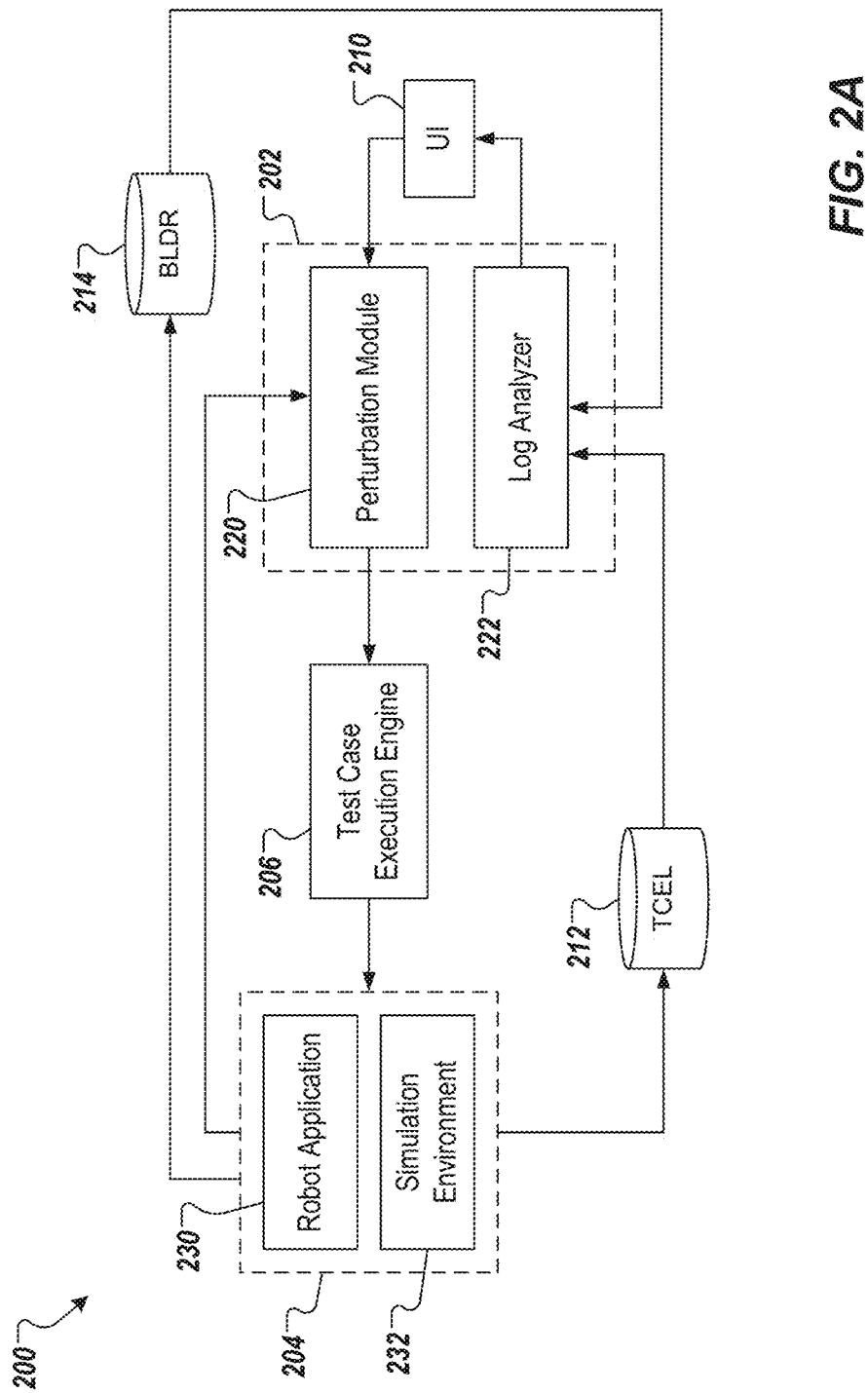
FIG. 2A depicts an example conceptual architecture of a robotic system testing platform in accordance with implementations of the present disclosure.

FIG. 2A depicts an example conceptual architecture 200 of a robotic system testing platform in accordance with implementations of the present disclosure. In the example of FIG. 2A, the conceptual architecture 200 includes a perturbation system 202, a simulation system 204, a test case execution engine (TCEE) 206, and a UI 210 (e.g., through which a SME can interact with the testing platform). The conceptual architecture 200 further includes a test case execution log (TCEL) repository 212 and a base line data reference (BLDR) repository 214. In the example of FIG. 2A, the perturbation system 202 includes a perturbation module 220 and a log analyzer 222, and the simulation system 204 includes a robotic application 230 and a simulation environment 232. In some examples, the robotic application 230 models the robotic system that is to be tested and can be provisioned using, for example, ROS. In some examples, the simulation environment 232 models the environment within which the robotic system will operate and can be provisioned as, for example, a Gazebo world.

In some implementations, and as described in further detail herein, the simulation environment simulates operation of a robotic system within an environment. The robotic system is represented as a robot model (e.g., using ROS) in the robot application. In some examples, an environment within which the robot is to operate is represented as a world model and can include objects (e.g., fixed objects, other robots, humans) in the environment and characteristics (e.g., wind, light, temperature, humidity) of the environment.

In some implementations, a baseline test case can be provided and can be representative of an expected operation of the robotic system within the environment without any perturbations applied. For example, the TCEE 206 can send a baseline test case to the simulation system 204, which simulates operations of the robotic system within the environment using the baseline test case. In some examples, the baseline test case can include data representative of operations that the robotic system is to perform in the environment. The simulation system 204 can provide baseline data representative of test results, which can be stored in the BLDR repository 214. For example, the baseline data can be representative of movement of an object (e.g., actuator arm of the robotic system) over time (e.g., in terms of X, Y, Z coordinates over time).

In accordance with implementations of the present disclosure, the perturbation generation system 202 generates perturbations for objects and/or characteristics, which perturbations can be included in one or more test cases provided by the TCEE 206. In some examples, each test case can include data representative of operations that the robotic system is to perform in the environment as well as perturbation data representative of one or more perturbations that are to be applied to the robotic system and/or the environment during execution of the operations within the environment. In some examples, the perturbation data indicates, for each perturbation, a type of perturbation and a degree of the perturbation. The TCEE 206 can send one or more test cases to the simulation system 204, which simulates operations of the robotic system within the environment using a respective test case and the perturbations represented therein. The simulation system 204 can provide test case result data representative of test results, which can be stored in the TCEL repository 214. For example, the test case results data can be representative of movement of one or more objects of the robotic system (e.g., actuator arm of the robotic system) over time (e.g., in terms of X, Y, Z coordinates over time). In some examples, the test case results data can be representative of movement of one or more objects of the environment (e.g., objects that the robotic system interacts with and/or manipulates).

In some implementations, the perturbation system 202 analyzes baseline data and test case results data to provide simulation results, which can be provided for display on the UI 210. Example test results can include, without limitation, a pass, a soft failure, and a hard failure, each of which is discussed in further detail with example reference to movement of an object. In some examples, the baseline data defines a pattern of movement (trajectory) of an object being considered and includes an envelope that defines an acceptable range (tolerance) of the trajectory, referred to herein as an envelope. With regard to pass, if a simulated trajectory of the object falls inside the envelope, the test case is considered as passed. With regard to soft failure, if the simulated trajectory of the object follows the pattern of the envelope, but is outside of the envelope, the test case is considered a soft failure. Soft failure can have different extents (e.g., an extent of excursion outside of the envelope). While a soft failure is not a failure of the robotic system itself, it can potentially cause a cascade of failures downstream (e.g., in case of an assembly line). A soft failure can be described as the robotic system partially achieving a goal. An example soft failure can include, without limitation, executing a process (e.g., moving an object from a first position to a second position) as expected, but execution of the process taking longer than expected. With regard to hard failure, if the simulated trajectory is outside of the envelope and is not a pattern that is similar to the envelope, the test case is considered as hard failure. A hard failure indicates that the robotic system itself failed, which can also potentially cause a cascade of failures downstream. That is, a hard failure indicates that the robotic system failed to achieve a goal. Example hard failures can include, without limitation, failure to pick up an object, and failure to place an object in an expected location.

Figure 2B:
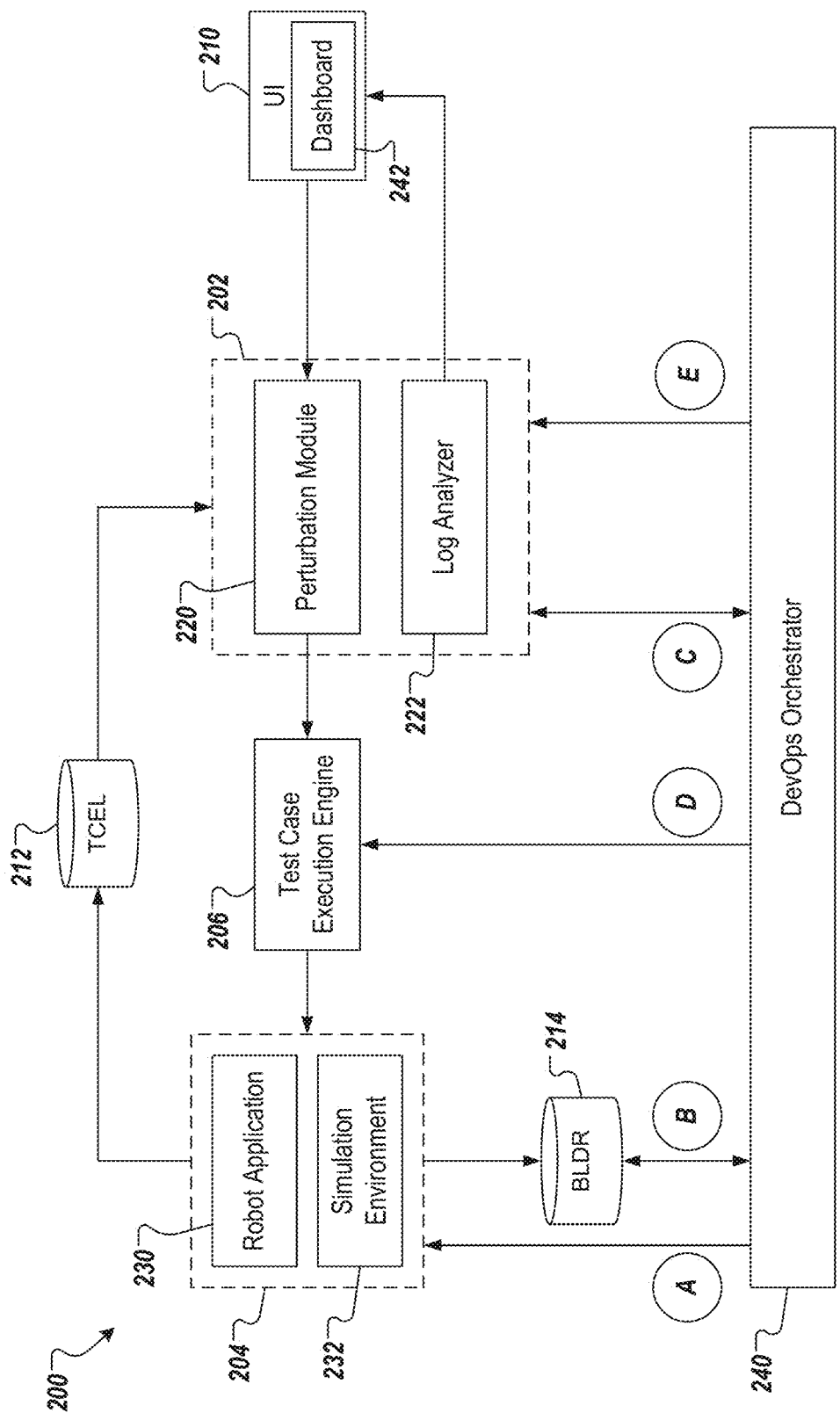
FIG. 2B depicts an example conceptual architecture of the robotic system testing platform integrated with a development pipeline in accordance with implementations of the present disclosure.

FIG. 2B depicts the example conceptual architecture 200 of the robotic system testing platform integrated with a development pipeline in accordance with implementations of the present disclosure. In the example of FIG. 2B, a DevOps orchestrator 240 and a dashboard 242 are provided. In a non-limiting example, the DevOps orchestrator 240 can be provided as a Jenkins pipeline, which can be described as a suite of plugins that supports implementing and integrating continuous delivery (CD) pipelines to provide an automated expression of a process (e.g., a robotic testing process). For example, a robotic testing process using the robotic system testing platform of the present disclosure can include a baseline data generation task (A), a baseline data retrieval task (B), a test case generation task (C), a test case execution task (D), and a results analysis task (E). For example, the baseline data generation task (A) can include a request to the simulation system 204 to execute a simulation of the robotic system without any perturbations. As a result, baseline data representative of test results are stored in the BLDR repository 214 and can be retrieved through execution of the baseline data retrieval task (B). The test case generation task (C) can be executed to prompt the perturbation system 202 to generate one or more test cases that include perturbations. The test case execution task (D) can be executed to prompt the TCEE 206 to trigger simulation of the robotic system by the simulation system 204 using the one or more test cases. The results analysis task (E) can be executed to trigger analysis of test case execution data in view of baseline data, as described in further detail herein.

Figure 3:
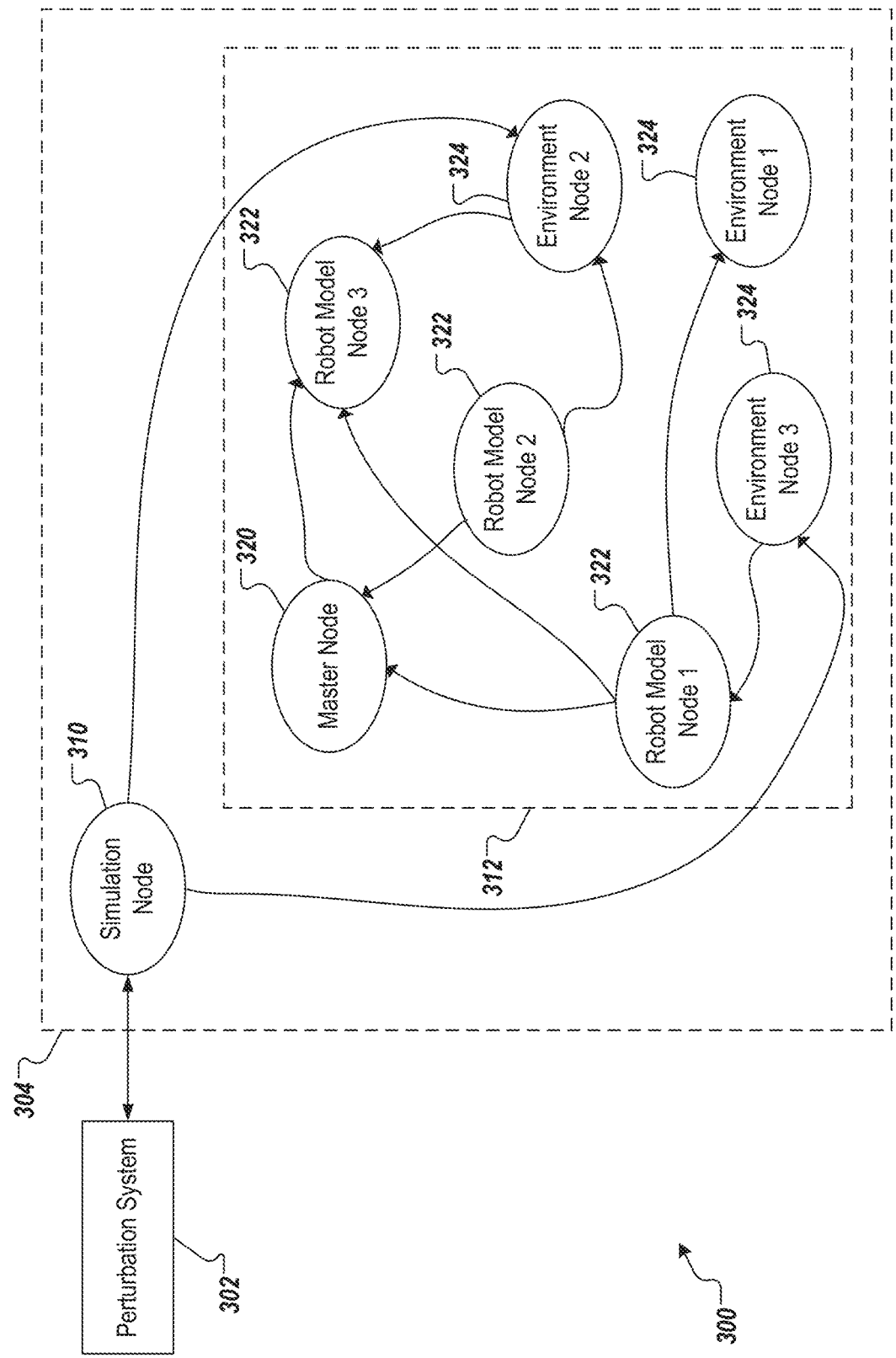
FIG. 3 depicts an example representation of interactions between a perturbation system and a simulation world in accordance with implementations of the present disclosure.

FIG. 3 depicts an example representation 300 of interactions between a perturbation system 302 and a simulation environment 304 in accordance with implementations of the present disclosure. In the example of FIG. 3, the simulation environment (e.g., Gazebo world) includes a simulation node 310 and an application core 312. The application core 312 includes a master node 320, a set of robot nodes 322, and a set of environment nodes 324. In some examples, the set of robot nodes 322 model a robotic system and the set of environment nodes 324 model an environment within which the robotic system operates. Messaging between nodes is based on topics, using the publish-subscribe paradigm introduced above.

Using example Gazebo and ROS as non-limiting examples, in a Gazebo simulation world various environment objects and robot models can be connected using ROS-Gazebo plugins. ROS nodes and topics information can be extracted from the ROS core (i.e., the core application 312). Using this information an entity relationship diagram can be generated with can help to introduce perturbations in the system. The entity relationship diagram is provided as a node graph, as depicted in the example of FIG. 3. The perturbation system 302 can extract information representative of the simulation environment 304 and information representative of the robotic system to perform analysis and generate perturbation using one or more perturbation types.

In some implementations, and as described in further detail herein, the perturbation system 302 can access a node information registry (e.g., provided within a project system) to retrieve information on each node of the robotic system and the environment. In some examples, the ROS core holds all information of the objects. In some examples, the perturbation system 302 can use a ROS service to request information on all of the objects available in the simulation from the ROS core. For example, to retrieve all node names, a ROS node list can be requested. From the ROS node list, one or more nodes can be selected for model properties querying (e.g., /gazebo/get_model_properties for a specified node). In response, object properties of the respective node are provided. Example properties can include, without limitation, those provided in Listing 1 below:

---
Listing 1: Example Object Properties Retrieval
---
header:
  seq: 1
  stamp:
    secs: 56
    nsecs: 910000000
  frame_id: "link"
pose:
  position:
    x: 0.432850556353
    y: 0.200356532408
    z: 0.72410189423

---
Listing 1: Example Object Properties Retrieval
---
  orientation:
    x: 7.85518870652e−05
    y: −0.000596246185999
    z: −0.382413877206
    w: 0.923990944133
twist:
  linear:
    x: 0.0
    y: 0.0
    z: 0.0
success: True
status_message: "GetModelState: got properties"

Properties of the simulation environment (e.g., gravity, wind, temperature) can also be retrieved in a similar way (e.g., /gazebo/get_world_properties). Likewise, information of the robotic system can be retrieved using the ROS service (e.g., /gazebo/get_model_properties "Robot joint"). Example properties can include, without limitation, those provided in Listing 2 below:

---
Listing 2: Example Robot Information Retrieval
---
/test/aws_chaos_robo$ rosservice call
/gazebo/get_model_properties arm1
parent_model_name: ''
canonical_body_name: ''
body_names: [linear_arm_actuator, base_link, shoulder_link,
upper_arm_link, forearm_link, wrist_1_link,
wrist_2_link, wrist_3_link, vacuum_gripper_link]
geom_names: [base_link_collision, shoulder_link_collision,
upper_arm_link_collision, forearm_link_collision,
wrist_1_link_collision, wrist_2_link_collision,
wrist_3_link_collision,
wrist_3_link_fixed_joint_lump__ee_link_collision_1,
vacuum_gripper_link_collision]
joint_names: [world_joint, linear_arm_actuator_joint,
shoulder_pan_joint, shoulder_lift_joint,
elbow_joint, wrist_1_joint, wrist_2_joint, wrist_3_joint,
vacuum_gripper_joint]
child_model_names: [ ]
is_static: False
success: True
status_message: "GetModelProperties: got properties"

Figure 4:
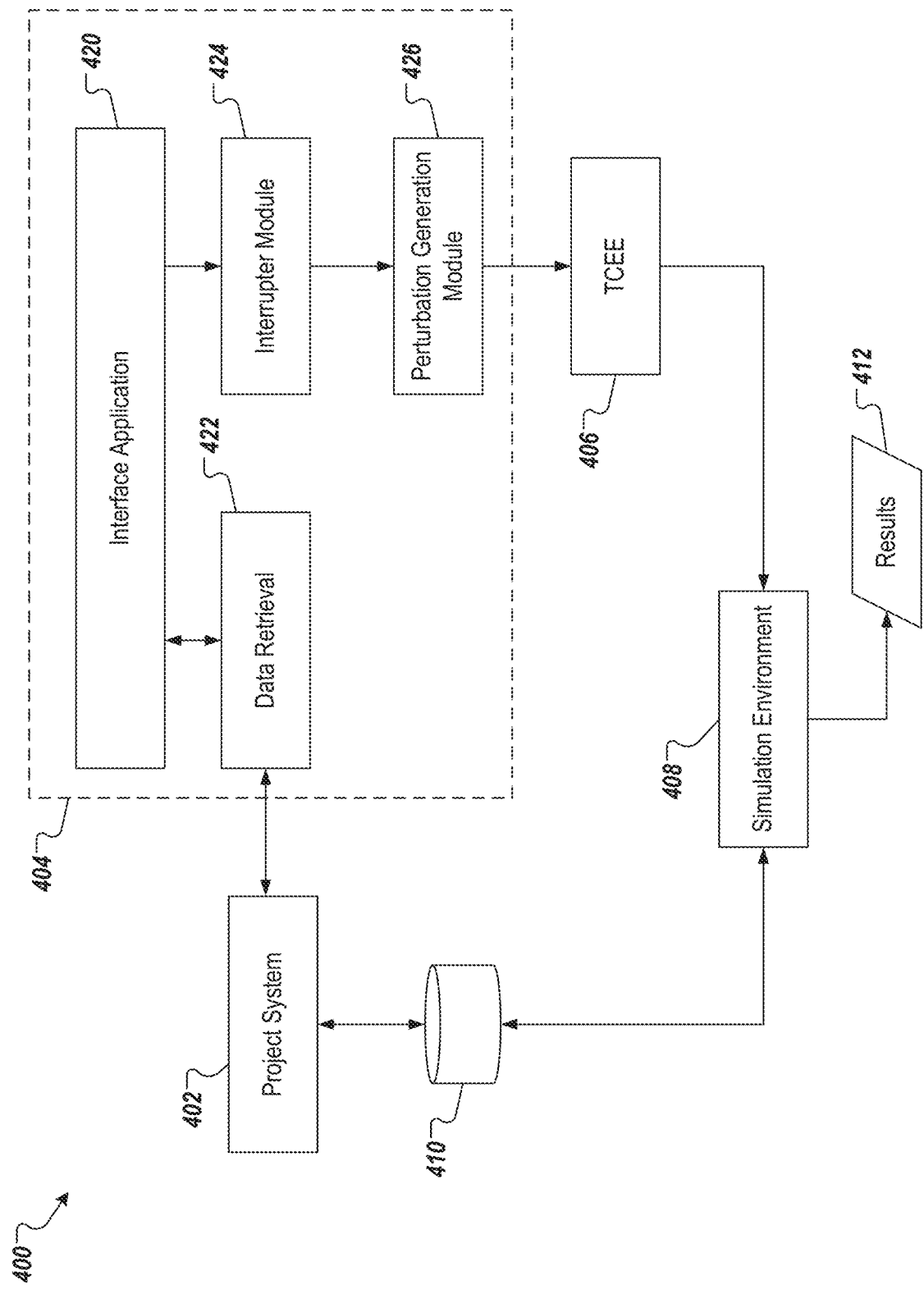
FIG. 4 depicts an example conceptual architecture to illustrate various perturbation types and implementation thereof in accordance with implementations of the present disclosure.

FIG. 4 depicts an example conceptual architecture 400 to illustrate various perturbation types and implementation thereof in accordance with implementations of the present disclosure. The example of FIG. 4 includes a project system 402, a perturbation system 404 (e.g., the perturbation system 202 of FIGS. 2A and 2B, the perturbation system 302 of FIG. 3), a TCEE 406 (e.g., the TCEE 206 of FIGS. 2A and 2B), a simulation environment 408 (e.g., the simulation environment 204 of FIGS. 2A and 2B), and a model store 410. In some examples, and as described in further detail herein, the perturbation system 404 generates a set of perturbations that can be used in one or more test cases that are executed by the simulation environment 408 to provides results 412. Each perturbation in the set of perturbations can be associated with a perturbation type. Example perturbation types include, without limitation, a location perturbation, an orientation perturbation, an environment physics perturbation, a node kill perturbation, a latency perturbation, and an add object perturbation. In the example of FIG. 4, the perturbation system 404 includes an interface application 420, a data retrieval module 422, an interrupter module 424, and a perturbation generation module 426.

In some examples, the interface application 420 is provided as a plugin framework that can parse a robotic system (e.g., provided in ROS) and populate all of the simulation world objects and models in a graphical UI (GUI). For example, a user (e.g., SME) can interact with the interface application 420 to select a project for testing, the project including a robotic system and an environment within which the robotic system is to operate in. The data retrieval module 422 can query the project system 402 for information on the project (i.e., the robotic system and the environment). The project system 402 can retrieve model data from the model store 410 (e.g., robot module, environment (world) model). In some examples, and without limitation, a project can be provided as an ROS project that includes robot structure code, robot controller code, simulation environment code, and static parameters code. For example, robot structure code can include objects that the robotic system is made up of (e.g., actuator arms, servo motors), each object being associated with a set of properties, such as coordinates and physics. In some examples, objects can be selected by the user through the interface application 420 and object data can be displayed to the user. For example, object data such as that represented in Listing 1 above can be displayed to the user (e.g., pose, twist).

In accordance with implementations of the present disclosure, perturbations can be introduced for testing of the robotic system. In some examples, the type and extent of the perturbations can be at least partially based on user input. For example, the user can use the interface application 420 to select one or more of location perturbation, an orientation perturbation, and an environment physics perturbation. In some examples, each perturbation type is associated with a set of parameters and, for each parameter, the user can provide input indicating a perturbation range. The perturbation range indicates a degree of perturbation that can be applied to a baseline value of the respective parameter.

For example, and without limitation, the user can select a particular object (e.g., actuator arm) and a location perturbation for the object. The location perturbation can include parameters of perturbation in X-direction, perturbation in Y-direction, perturbation in Z-direction, acceptable deviation in trajectory. In some examples, each parameter can be set to a value within a range (e.g., 0% to 100%). By way of non-limiting example, if a value of 10% is set for the X-direction perturbation, any perturbation of the X coordinate of the object that is applied during simulation cannot exceed 10% of the baseline value. As another example, the user can select environment physics perturbation, which can include parameters of gravity perturbation, temperature perturbation, wind perturbation, humidity perturbation, light perturbation, and the like (e.g., any physical characteristic of the environment that is accounted for in the environment world). In some examples, each parameter can be set to a value within a range (e.g., 0% to 100%). By way of non-limiting example, if a value of 5% is set for the humidity perturbation, any perturbation of the humidity of the environment that is applied during simulation cannot exceed 5% of a baseline value.

Referring again to FIG. 4, after the interface application 420 provides a baseline state of the robotic system and the user has provided uncertainty ranges for parameters of perturbation types, the interrupter module 424 and the perturbation generation module 426 use this information to introduce one or more perturbations on the robot application or objects in the simulation world. In some examples, for each perturbation type, the interrupter module 424 determines, for each object of one or more objects, a perturbation value that is to be applied during the simulation constrained by any uncertainty ranges set by the user. In some examples, the perturbation generation module 426 provides, for each perturbation, perturbation code to implement the perturbation in a test case of the simulation. The TCEE 406 provides a set of test cases to the simulation environment 408. In some examples, each test case includes one or more operations (e.g., a process) that are to be performed by one or more objects and a set of perturbations to be applied during execution of the one or more operations. In some examples, the simulation environment retrieves the project from the project system and execute one or more iterations of testing based on the test cases to provide the results. In some examples, and in a scenario including multiple test cases, test cases can be executed sequentially (e.g., in a local computing system) or can be executed in parallel (e.g., in a cloud-based computing system).

In some implementations, sensors that are present in the robotic system and/or the environment can be accounted for in the robotic model (e.g., as a model object) or the simulation world (e.g., as a world object). In some examples, sensors can be provided as sensor objects separate from the robotic model and the simulation world. In some implementations, perturbations can be introduced to sensors. For example, a sensor can be responsive to a location of an object and generate a signal based on the location, such that one or more downstream processes can be executed based on the signal (e.g., stop operation of a robot if the signal indicates the object is out of place). As another example, a sensor can be responsive to physics of the environment (e.g., wind speed sensor, temperature sensor, humidity sensor) and can generate a signal based on the physics, such that one or more downstream processes can be executed based on the signal (e.g., stop operation of a robot if the signal indicates temperature in the environment exceeds a threshold temperature).

In some implementations, perturbations can be determined using one or more ML models. For example, a ML model can be trained on real-world training data that represents actual variations of characteristics of objects and/or environments. Using location as a non-limiting example, a ML model can be trained to predict one or more location perturbations for one or more objects. For example, a ML model can be specific to a type of object and can be trained to predict a set of location perturbations for the object. In some examples, a type of the object is provided as input to the ML model, which provides a set of location perturbations as output.

In some implementations, perturbations can be determined by injecting randomness using one or more distributions. An example distribution can include, without limitation, a Poisson distribution. Using node kill perturbation and latency perturbation as non-limiting examples, the distribution is used to select one or more nodes of the robotic system and/or environment for perturbation. In the case of node kill perturbation, the nodes selected based on the distribution can be killed during the simulation (e.g., by executing rosnode kill <node_id>). In the case of latency perturbation, the nodes selected based on the distribution can have a latency applied to one or more messages that the node sends during the simulation. That is, for example, a publisher node can have a latency applied to messages sent associated with one or more topics. The latency can represent real-world scenarios, in which network communications are disrupted due to signal distortion, for example (e.g., received signal strength indication (RSSI) signal distortion).

In some implementations, nodes, to which one or more perturbations are selected from a set of active nodes. In some examples, the set of active nodes includes nodes that are active during the simulation. For example, a robotic system and/or simulation world, individually or collectively, can include hundreds, if not thousands of nodes or more. However, not all nodes are active during simulation. Consequently, applying perturbations to nodes that are not active not only obviates testing (i.e., perturbations applied to inactive nodes have no effect), it needlessly consumes computing resources. In some examples, during execution of a simulation for a baseline test case (i.e., a test case that is absent perturbations) nodes that are active during the simulation are recorded and are included in the set of active nodes.

Figure 5:
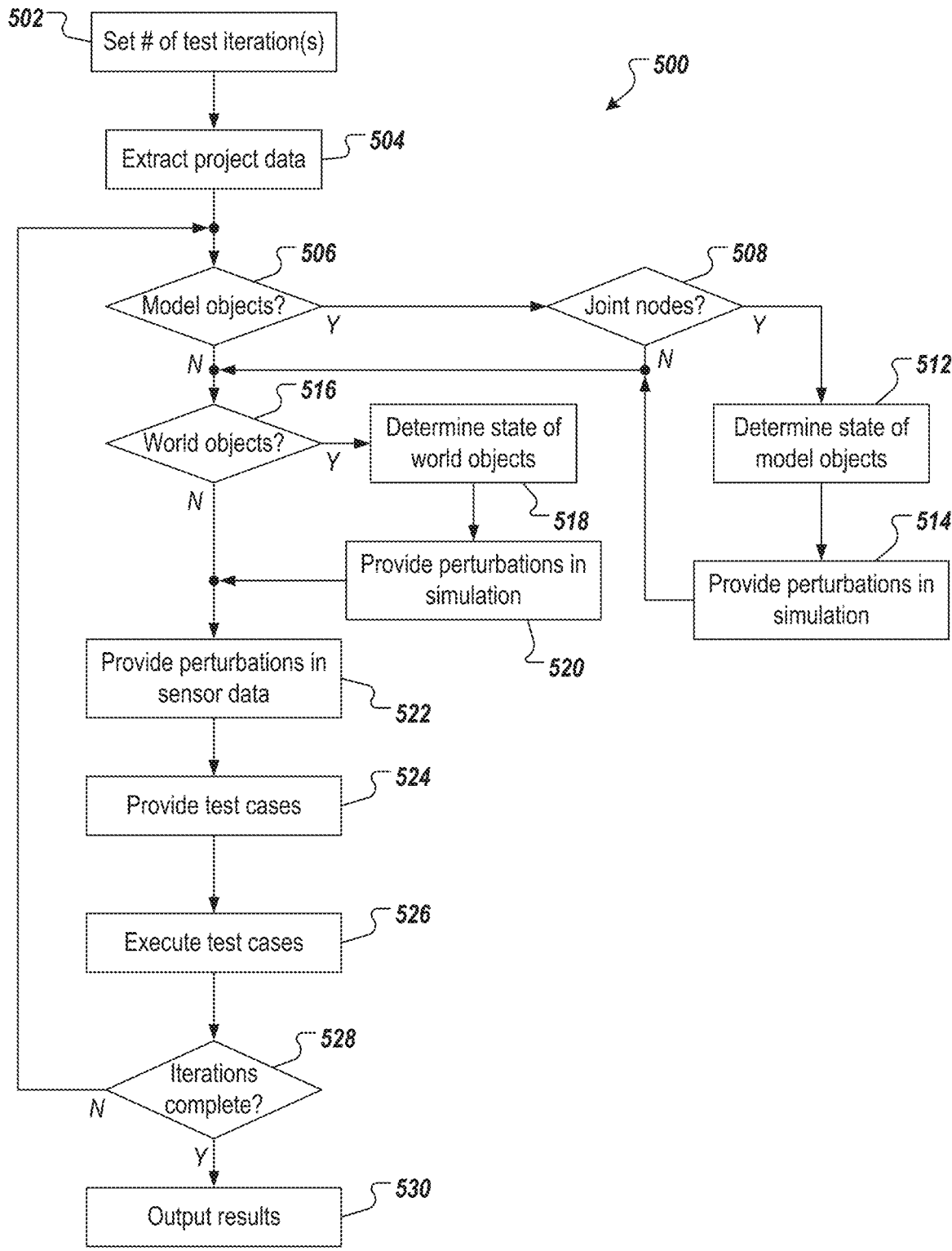
FIG. 5 depicts an example process that can be executed in accordance with implementations of the present disclosure.

FIG. 5 depicts an example process 500 that can be executed in accordance with implementations of the present disclosure. In some examples, the example process 500 is provided using one or more computer-executable programs executed by one or more computing devices.

A number of iterations is set (502). For example, a user can interact with a perturbation system through an interface application (e.g., the interface application 420 of FIG. 4) to input a number of iterations for testing of a robotic system. In some examples, the user can indicate a project, which includes a robotic system and a simulation world, by selecting the project from a list of available projects displayed by the interface application. Project data is extracted (504). For example, and as described herein, a data retrieval module (e.g., the data retrieval module 422 of FIG. 4) can request project data from a project system (e.g., the project system 402 of FIG. 4). In some examples, the user can use the interface application to select perturbations that are to be applied to one or more objects. In some examples, the user can select one or more of location perturbation, an orientation perturbation, and an environment physics perturbation. In some examples, and as described in further detail herein, each perturbation type is associated with a set of parameters and, for each parameter, the user can provide input indicating a perturbation range. The perturbation range indicates a degree of perturbation that can be applied to a baseline value of the respective parameter.

It is determined whether model objects are provided for in the project data (506). For example, and as described herein, model objects represent components of a robot in a robotic system. With reference to an example robotic system including a robotic arm, example model objects can include linear arm actuator, base link, shoulder link, upper arm link, forearm link, wrist link, vacuum gripper link, world joint, linear arm actuator joint, shoulder pan joint, shoulder lift joint, elbow joint, wrist joint, and vacuum gripper joint. Here, a link can be a mechanical structure and a joint connects two or more mechanical structures for relative movement therebetween.

If model objects are provided for in the project data, it is determined whether the model objects include joint objects (508). If the model objects include joint objects, a state of each model object is determined (512), perturbations are provided (514), and the example process 500 loops back. For example, and as described herein, the interface application provides a baseline state of the robotic system and the user-provided uncertainty ranges for parameters of perturbation types. An interrupter module and a perturbation generation module use this information to introduce one or more perturbations on the robot application or objects in the simulation world. In some examples, for each perturbation type, the interrupter module determines, for each object of one or more objects, a perturbation value that is to be applied during the simulation constrained by any uncertainty ranges set by the user. In some examples, the perturbation generation module provides, for each perturbation, perturbation code to implement the perturbation in a test case of the simulation.

If model objects are not provided for in the project data or if the model objects do not include joint nodes, it is determined whether any world objects are included in the project data (516). If the project data includes world objects, a state of each world object is determined (518), perturbations are provided (520). For example, and as described herein, the interrupter module and the perturbation generation module introduce one or more perturbations on world objects in the simulation world relative to respective baselines of the world objects.

Perturbations are provided in sensor data (522). For example, for any sensors that are modeled in the simulation, perturbations in signals generated by the sensors can be provided. In some examples, a perturbation can indicate variance in a signal of a sensor that is within an acceptable range (e.g., the sensor is operating normally). In some examples, a perturbation can indicate variance in a signal of a sensor that is outside of an acceptable range (e.g., the sensor is operating abnormally).

A set of test cases is provided (524). For example, and as described herein, a TCEE (e.g., the TCEE 406 of FIG. 4) provides a set of test cases to a simulation environment (e.g., the simulation environment 408 of FIG. 4). In some examples, each test case includes one or more operations (e.g., a process) that are to be performed by one or more objects and a set of perturbations to be applied during execution of the one or more operations. The test cases are executed (526). For example, and as described herein, the simulation environment retrieves the project from the project system and executes an iteration of testing based on the test cases to provide the test results. It is determined whether the iterations are complete (528). If the iterations are not complete, the example process 500 loops back to determine another set of test cases for a next iteration. If the iterations are complete, results are output (530). For example, and as described herein, test results for each iteration can be displayed to the user. Example test results are described in further detail herein.

Figure 6A:
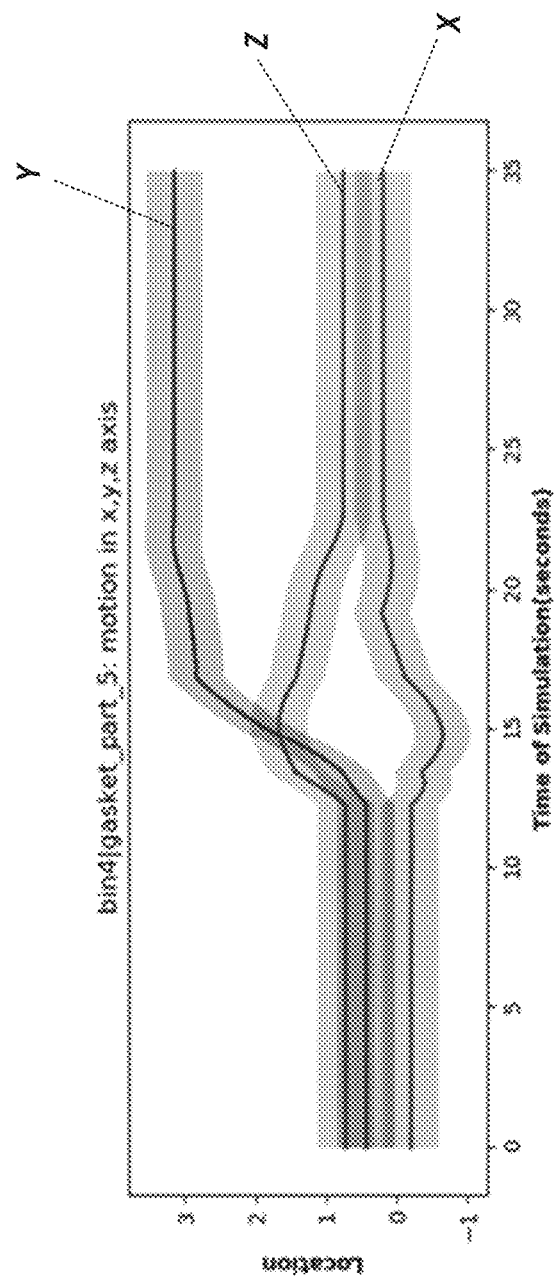
FIGS. 6A-6C depict example graphical representations of test results in accordance with implementations of the present disclosure.
Figure 6B:
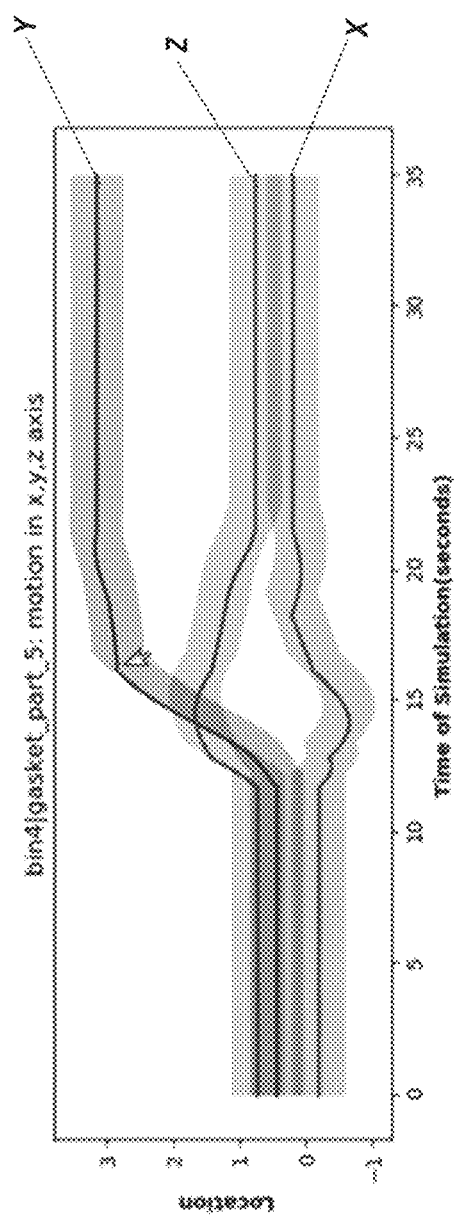
Figure 6C:
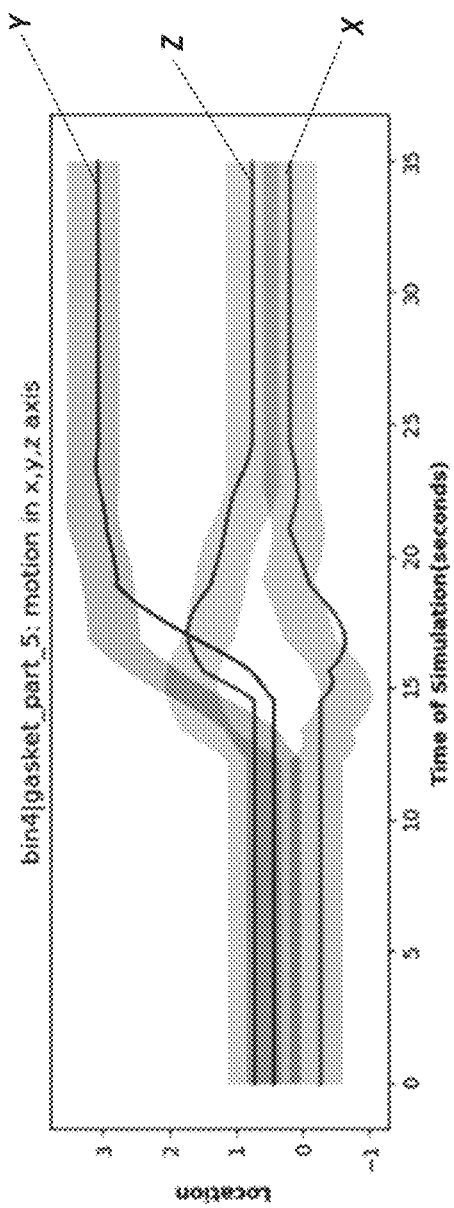

FIGS. 6A-6C depict example graphical representations of test results in accordance with implementations of the present disclosure. The examples of FIGS. 6A-6C represent test results of an object (e.g., bin4|gasket_part_5) and an aspect of the object, namely, movement in X, Y, Z directions during a simulation. For example, the object can be a world object, such as a part (e.g., gasket) that is to be moved by a robotic system (e.g., from a conveyor to a bin), and the test results represent movement of the object in the simulation.

The example of FIG. 6A can include baseline results that represent movement of the object within the environment as expected and without perturbations. For example, the test results of FIG. 6A can be generated using a baseline test case executed by the simulation system. As depicted in FIG. 6A, an envelope is provided for each direction indicating an acceptable degree of divergence before indicating a failure. The example of FIG. 6B can include a first test case including perturbations that were applied during the simulation. The example of FIG. 6B represents a pass, because the trajectory of each direction remains within the respective envelope. The example of FIG. 6C can include a second test case including perturbations that were applied during the simulation. The example of FIG. 6C represents a soft failure, because the trajectory of each direction corresponds to the respective trajectory pattern, but deviates from the respective envelope. The example of FIG. 6C can represent a scenario in which perturbations of the second test case result in the object moving from a first position to a second position, but more slowly than expected. In this case, the process (i.e., movement of the object) was completed, but could still have a cascading effect (e.g., not in the second position in time for a robot to grab the object).

Implementations and all of the functional operations described in this specification may be realized in digital electronic circuitry, or in computer software, firmware, or hardware, including the structures disclosed in this specification and their structural equivalents, or in combinations of one or more of them. Implementations may be realized as one or more computer program products (i.e., one or more modules of computer program instructions encoded on a computer readable medium for execution by, or to control the operation of, data processing apparatus). The computer readable medium may be a machine-readable storage device, a machine-readable storage substrate, a memory device, a composition of matter effecting a machine-readable propagated signal, or a combination of one or more of them. The term "computing system" encompasses all apparatus, devices, and machines for processing data, including by way of example a programmable processor, a computer, or multiple processors or computers. The apparatus may include, in addition to hardware, code that creates an execution environment for the computer program in question (e.g., code that constitutes processor firmware, a protocol stack, a database management system, an operating system, or any appropriate combination of one or more thereof). A propagated signal is an artificially generated signal (e.g., a machine-generated electrical, optical, or electromagnetic signal) that is generated to encode information for transmission to suitable receiver apparatus.

A computer program (also known as a program, software, software application, script, or code) may be written in any appropriate form of programming language, including compiled or interpreted languages, and it may be deployed in any appropriate form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry (e.g., an FPGA (field programmable gate array) or an ASIC (application specific integrated circuit)).

Processors suitable for the execution of a computer program include, by way of example, both general and special purpose microprocessors, and any one or more processors of any appropriate kind of digital computer. Generally, a processor will receive instructions and data from a read only memory or a random access memory or both. Elements of a computer can include a processor for performing instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks). However, a computer need not have such devices. Moreover, a computer may be embedded in another device (e.g., a mobile telephone, a personal digital assistant (PDA), a mobile audio player, a Global Positioning System (GPS) receiver). Computer readable media suitable for storing computer program instructions and data include all forms of non-volatile memory, media and memory devices, including by way of example semiconductor memory devices (e.g., EPROM, EEPROM, and flash memory devices); magnetic disks (e.g., internal hard disks or removable disks); magneto optical disks; and CD ROM and DVD-ROM disks. The processor and the memory may be supplemented by, or incorporated in, special purpose logic circuitry.

To provide for interaction with a user, implementations may be realized on a computer having a display device (e.g., a CRT (cathode ray tube), LCD (liquid crystal display) monitor) for displaying information to the user and a keyboard and a pointing device (e.g., a mouse, a trackball, a touch-pad), by which the user may provide input to the computer. Other kinds of devices may be used to provide for interaction with a user as well; for example, feedback provided to the user may be any appropriate form of sensory feedback (e.g., visual feedback, auditory feedback, tactile feedback); and input from the user may be received in any appropriate form, including acoustic, speech, or tactile input.

Implementations may be realized in a computing system that includes a back end component (e.g., as a data server), a middleware component (e.g., an application server), and/or a front end component (e.g., a client computer having a graphical user interface or a Web browser, through which a user may interact with an implementation), or any appropriate combination of one or more such back end, middleware, or front end components. The components of the system may be interconnected by any appropriate form or medium of digital data communication (e.g., a communication network). Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

The invention claimed is:

1. A computer-implemented method for testing a robotic system, the method comprising:
   providing a robotic model representative of the robotic system that is to operate in a real-world environment;
   determining baseline data by executing a simulation using the robotic model and a simulation world, the simulation world representing the real-world environment,
      wherein the robotic model and the simulation world comprises one or more objects,
      wherein the baseline data indicates a pattern of movement of an object of the one or more objects and an envelope of an acceptable tolerance of the pattern,
      wherein the baseline data includes a set of active nodes of a plurality of nodes of the robotic model and the simulation world, and
      wherein the set of active nodes comprising nodes that are active during the simulation;
   generating, by a perturbation system, perturbations to be included in a set of test cases,
      wherein each test case of the set of test cases comprising at least one perturbation of the perturbations to at least one object of the one or more objects of the robotic model and the simulation world relative to a baseline of the at least one object determined from the baseline data,
      wherein a first set of perturbations of the perturbations is generated by a machine learning model trained on real-world training data that represents actual variations of characteristics of the one or more objects, and
      wherein the at least one perturbation comprising a latency perturbation that represents a disruption in communication between nodes of the plurality of nodes of the robotic model and the simulation world;
   determining test result data for each test case of the set of test cases by, for each test case, modifying the at least one object in view of the at least one perturbation to provide a modified object based on the test result data and executing the simulation with the modified object,
      wherein executing the simulation with the modified object comprises applying the at least one perturbation to the set of active nodes,
      wherein the test result data for a test case of the set of test cases indicates one of a pass, a soft failure, or a hard failure related to the object,
      wherein the soft failure indicates that:
         a simulated pattern of movement of the object follows the pattern of the movement of the object indicated by the baseline data, and
         the simulated pattern of the movement of the object is outside the envelope, and
      wherein the hard failure indicates that the simulated pattern of the movement of the object deviates from the pattern of the movement of the object indicated by the baseline data; and
   displaying a graph representative of the at least one object based on the baseline data and the test result data for the test case of the set of test cases, the graph depicting variance of the object during the simulation using the test case based on one of the pass, the soft failure, or the hard failure.

2. The computer-implemented method of claim 1, wherein the perturbations comprise one or more of location perturbation, node kill perturbation, the latency perturbation, and add object perturbation.

3. The computer-implemented method of claim 2, wherein at least one other perturbation comprises a location perturbation and the modified object is in a modified position based on the location perturbation.

4. The computer-implemented method of claim 1, further comprising after determining the baseline data, receiving user input indicating a degree of uncertainty associated with at least one parameter of the at least one object, wherein a second set of perturbation of the perturbations is generated based on the degree of uncertainty.

5. The computer-implemented method of claim 1, wherein one or more of the perturbations are provided based on a distribution.

6. The computer-implemented method of claim 5, wherein the distribution is used to select nodes of objects represented in one or more of the robotic model and the simulation world, to which the one or more perturbations are to be applied in test cases of the set of test cases.

7. The computer-implemented method of claim 1, wherein each of the robotic model and the simulation world are provided as the plurality of nodes in a node graph, the plurality of nodes communicate with one another using a publish-subscribe paradigm.

8. A non-transitory computer-readable storage medium coupled to one or more processors and having instructions stored thereon which, when executed by the one or more processors, cause the one or more processors to perform operations for testing a robotic system, operations comprising:
   providing a robotic model representative of the robotic system that is to operate in a real-world environment;
   determining baseline data by executing a simulation using the robotic model and a simulation world, the simulation world representing the real-world environment,
      wherein the robotic model and the simulation world comprises one or more objects,
      wherein the baseline data indicates a pattern of movement of an object of the one or more objects and an envelope of an acceptable tolerance of the pattern,
      wherein the baseline data includes a set of active nodes of a plurality of nodes of the robotic model and the simulation world, and
      wherein the set of active nodes comprising nodes that are active during the simulation;
   generating, by a perturbation system, perturbations to be included in a set of test cases,
      wherein each test case of the set of test cases comprising at least one perturbation of the perturbations to at least one object of the one or more objects of the robotic model and the simulation world relative to a baseline of the at least one object determined from the baseline data,
wherein a first set of perturbations of the perturbations is generated by a machine learning model trained on real-world training data that represents actual variations of characteristics of the one or more objects, and
wherein the at least one perturbation comprising a latency perturbation that represents a disruption in communication between nodes of the plurality of nodes of the robotic model and the simulation world;
determining test result data for each test case of the set of test cases by, for each test case, modifying the at least one object in view of the at least one perturbation to provide a modified object based on the test result data and executing the simulation with the modified object,
wherein executing the simulation with the modified object comprises applying the at least one perturbation to the set of active nodes,
wherein the test result data for a test case of the set of test cases indicates one of a pass, a soft failure, or a hard failure related to the object,
wherein the soft failure indicates that:
a simulated pattern of movement of the object follows the pattern of the movement of the object indicated by the baseline data, and
the simulated pattern of the movement of the object is outside the envelope, and
wherein the hard failure indicates that the simulated pattern of the movement of the object deviates from the pattern of the movement of the object indicated by the baseline data; and
displaying a graph representative of the at least one object based on the baseline data and the test result data for the test case of the set of test cases, the graph depicting variance of the object during the simulation using the test case based on one of the pass, the soft failure, or the hard failure.

9. The non-transitory computer-readable storage medium of claim 8, wherein the perturbations comprise one or more of location perturbation, node kill perturbation, the latency perturbation, and add object perturbation.

10. The non-transitory computer-readable storage medium of claim 9, wherein at least one other perturbation comprises a location perturbation and the modified object is in a modified position based on the location perturbation.

11. The non-transitory computer-readable storage medium of claim 8, wherein operations further comprise after determining the baseline data, receiving user input indicating a degree of uncertainty associated with at least one parameter of the at least one object, wherein a second set of perturbation of the perturbations is generated based on the degree of uncertainty.

12. The non-transitory computer-readable storage medium of claim 8, wherein one or more of the perturbations are provided based on a distribution.

13. A system, comprising:
a computing device; and
a computer-readable storage device coupled to the computing device and having instructions stored thereon which, when executed by the computing device, cause the computing device to perform operations for testing a robotic system, operations comprising:
providing a robotic model representative of the robotic system that is to operate in a real-world environment;
determining baseline data by executing a simulation using the robotic model and a simulation world, the simulation world representing the real-world environment,
wherein the robotic model and the simulation world comprises one or more objects,
wherein the baseline data indicates a pattern of movement of an object of the one or more objects and an envelope of an acceptable tolerance of the pattern,
wherein the baseline data includes a set of active nodes of a plurality of nodes of the robotic model and the simulation world, and
wherein the set of active nodes comprising nodes that are active during the simulation;
generating, by a perturbation system, perturbations to be included in a set of test cases,
wherein each test case of the set of test cases comprising at least one perturbation of the perturbations to at least one object of the one or more objects of the robotic model and the simulation world relative to a baseline of the at least one object determined from the baseline data,
wherein a first set of perturbations of the perturbations is generated by a machine learning model trained on real-world training data that represents actual variations of characteristics of the one or more objects, and
wherein the at least one perturbation comprising a latency perturbation that represents a disruption in communication between nodes of the plurality of nodes of the robotic model and the simulation world;
determining test result data for each test case of the set of test cases by, for each test case, modifying the at least one object in view of the at least one perturbation to provide a modified object based on the test result data and executing the simulation with the modified object,
wherein executing the simulation with the modified object comprises applying the at least one perturbation to the set of active nodes,
wherein the test result data for a test case of the set of test cases indicates one of a pass, a soft failure, or a hard failure related to the object,
wherein the soft failure indicates that:
a simulated pattern of movement of the object follows the pattern of the movement of the object indicated by the baseline data, and
the simulated pattern of the movement of the object is outside the envelope, and
wherein the hard failure indicates that the simulated pattern of the movement of the object deviates from the pattern of the movement of the object indicated by the baseline data; and
displaying a graph representative of the at least one object based on the baseline data and the test result data for the test case of the set of test cases, the graph depicting variance of the object during the simulation using the test case based on one of the pass, the soft failure, or the hard failure.

14. The system of claim 13, wherein the perturbations comprise one or more of location perturbation, node kill perturbation, the latency perturbation, and add object perturbation.

15. The system of claim 14, wherein at least one other perturbation comprises a location perturbation and the modified object is in a modified position based on the location perturbation.

16. The system of claim 13, wherein operations further comprise after determining the baseline data, receiving user input indicating a degree of uncertainty associated with at least one parameter of the at least one object, wherein a second set of perturbation of the perturbations is generated based on the degree of uncertainty.

17. The system of claim 13, wherein one or more of the perturbations are provided based on a distribution.

18. The system of claim 13, wherein each of the robotic model and the simulation world are provided as the plurality of nodes in a node graph, the plurality of nodes communicate with one another using a publish-subscribe paradigm.

* * * * *